United States Patent [19]

Miller et al.

[11] Patent Number: 5,062,203
[45] Date of Patent: Nov. 5, 1991

[54] METHOD OF MAKING A FLEXIBLE MEMBRANE CIRCUIT TESTER

[75] Inventors: Brian S. Miller, Stafford; David R. Kaplan, Burke, both of Va.

[73] Assignee: The United States of America as represented by the Secretary of the Army, Washington, D.C.

[21] Appl. No.: 658,805

[22] Filed: Feb. 22, 1991

Related U.S. Application Data

[62] Division of Ser. No. 551,370, Jul. 10, 1990.

[51] Int. Cl.⁵ ............................................. H01K 3/10
[52] U.S. Cl. .................................... 29/852; 156/656; 156/668; 174/254
[58] Field of Search ......................... 29/852, 853, 846; 174/254, 255; 156/656, 668; 324/158 P, 158 F; 439/482

[56] References Cited

U.S. PATENT DOCUMENTS

| | | | |
|---|---|---|---|
| 3,405,361 | 10/1968 | Kattner et al. | 324/158 P |
| 4,566,186 | 1/1986 | Bauer et al. | 29/852 |
| 4,891,584 | 1/1990 | Kamieniecki et al. | 324/158 R |
| 4,908,574 | 3/1990 | Rhoades et al. | 324/690 |
| 4,922,192 | 5/1990 | Gross et al. | 324/158 F |
| 4,964,212 | 10/1990 | Deroux-Dauphin et al. | 29/852 |
| 5,012,187 | 4/1991 | Littlebury | 324/158 F |

Primary Examiner—P. W. Echols
Attorney, Agent, or Firm—Milton W. Lee; Anthony T. Lane

[57] ABSTRACT

A pattern of electrodes, with electrical lead lines to the electrodes, are carried by a thin-film membrane mounted on a frame. The pattern corresponds to a test point pattern on a circuit to be tested. The lead lines go to edge connectors on the frame. In order to test a circuit, the membrane is pushed against the test points by air pressure, such that capacitive coupling occurs between the electrodes and the test points.

1 Claim, 2 Drawing Sheets

METHOD OF MAKING A FLEXIBLE MEMBRANE CIRCUIT TESTER

The invention described herein may be manufactured, used, and licensed by the U.S. Government for governmental purposes without the payment of any royalties thereon.

This application is a division of application Ser. No. 7/551,370 filed July 10, 1990.

BACKGROUND OF INVENTION

This invention is in the field of testing devices for integrated electronic circuits. It is particularly concerned with and arose from the need to test wafers with infrared detector arrays theron. Prior to hybridizing (adding a readout device thereto) it is desirable to test the operability of the diodes of the array, this is done to eliminate faulty arrays from further expensive processing. The current technique is to use sharpened probes to contact indium bumps test points connected on the wafers to the diodes. This technique has problems of probe alignment with the bumps, propensity for probe induced damage, and the propensity for probes to stick to the bumps during contact. If capacitive testing rather than actual contact is used, it is difficult to maintain a fixed probe distance from the test points (bumps). The present invention overcomes these problems by eliminating sharpened probes and employing a thin, flexible membrane with capacitively-coupled planar probes thereon.

SUMMARY OF THE INVENTION

The invention is embodiments of a tester for infrared diode arrays on a substrate (chip) and methods of making such testers. The testers include essentially planar electrodes carried by a flexible membrane which also carries connecting leads to the probes. In use, the membrane is pressed against test points on the substrate such that capacitive coupling occurs between the electrodes and the test points when a test voltage is applied.

DESCRIPTION OF PREFERRED EMBODIMENTS OF THE INVENTION

Figure 1:
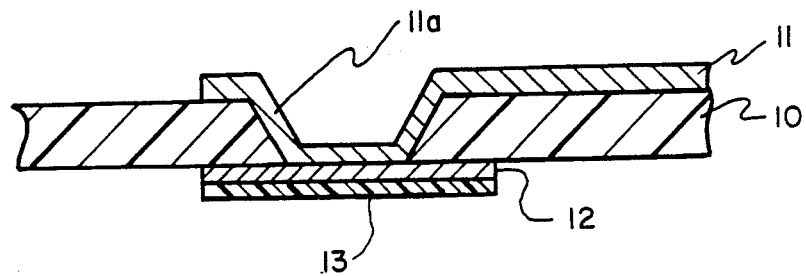
FIG. 1 is a partial cross-sectional view of one embodiment of the invention.

The invention may perhaps be best understood by referring to the drawings. Regarding the FIG. 1 embodiment, we see (not to scale) a test probe including a relatively thin film membrane 10 (on the order of a mil thick) made of a low-dielectric constant material such as Mylar. Atop 10 we see a portion of lead line 11, which has a portion 11a extending through 10 and in contact with electrode 12. This electrode is covered with a layer of high-dielectric material such as alumina. It should be understood that a multiplicity of these test probes will be supported by a single membrane, as will be described in FIG. 4.

Figure 2:
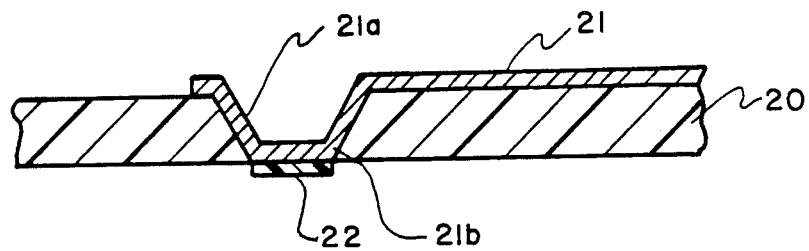
Fig. 2 is a partial cross-sectional view on another embodiment of the invention, taken in direction 2—2 on FIG. 4.

Turning now to FIG. 2, we see membrane 20 supporting lead line 21. This lead line has a portion 21a extending through 20 and with a bottom portion 21b coplanar with the opposite side of 20 from 21. Finally, this coplanar portion 21b is covered by a high-dielectric constant layer 22.

Figure 3:
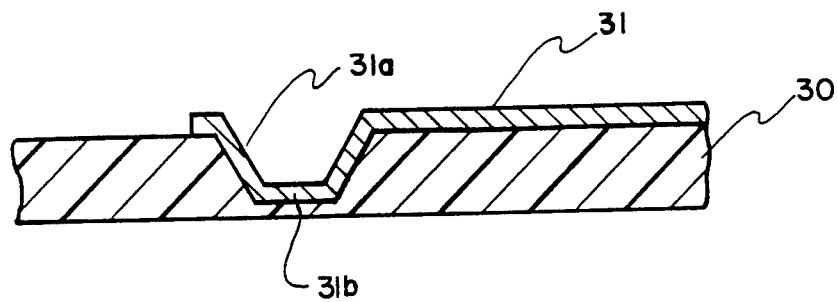
FIG. 3 is a partial cross-sectional view of yet another embodiment of the invention.

In FIG. 3, membrane 30 carries lead line 31, with portion 31 extending into 30, and bottom portion 31b. As can be seen, 31a–31b do not extend all the way through membrane 30.

Figure 4:
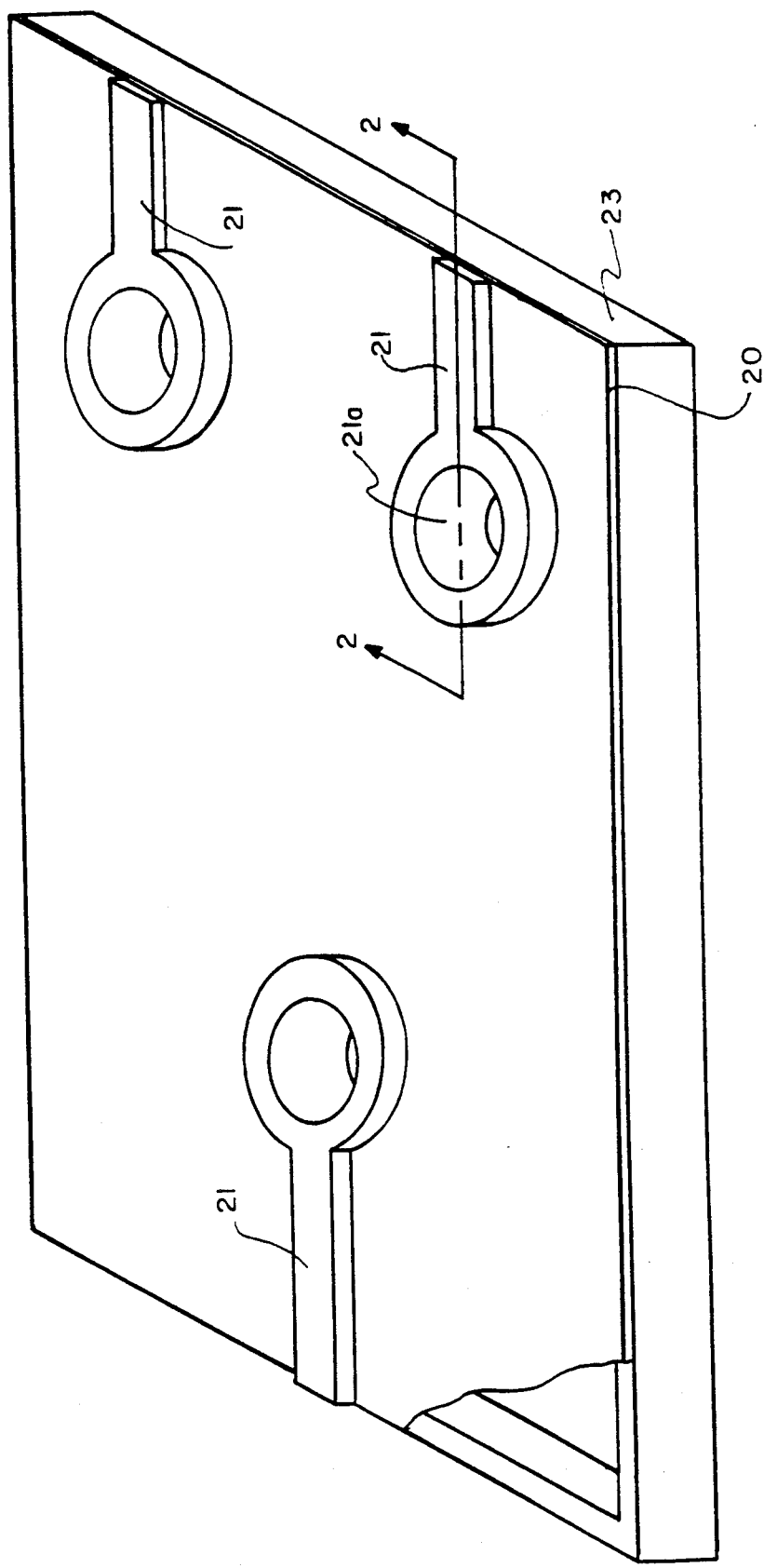
FIG. 4 is an isometric view of a simplified version of the invention, partially cut away.

Looking now at FIG. 4, we see a very simplified version of one embodiment of the invention. Membrane 20, described above in the FIG. 2 embodiment is supported by frame 23. Each probe has its lead line extending to the edge of the frame, where connections to an external test circuit are made. In an actual embodiment of the invention, it should be understood that dozens or many hundreds of test probes may be carried by a frame. The physical size of the frame will be determined by the size of the circuit under test. The size of the probes is determined by the test point size on the circuit under test. A typical size is on the order of a mil. The thickness of the lead lines is not critical, but will be on the order of 1/10 micron.

In use, the circuit or chip under test is held in a testing jig, the inventive device is placed over the circuit and in registration therewith, and differential air pressure is applied to cause intimate contact between the circutit and the device. Obviously, the testing jig will include means to connect to the various lead lines of the device. The circuit is then tested by applying appropriate voltages to the various lead lines and measuring the desired electrical characteristic, such as capacitance or impedance vs displacement current.

The methods by which the various embodiments are made are similar in some respects, but vary in others. All methods begin with the selection or preparation of a suitable frame in accordance with the circuit to be tested. The thin membrane is then applied to this frame by any desired method, such as stretching a layer of the membrane over the frame and bonding the two together adhesively or otherwise. In the FIG. 1 embodiment, a pattern of electrodes (such as 12 in FIG. 1) is lithographically applied to the membrane. Holes are then formed through the membrane from the side opposite to the electrodes, using laser ablation or lithographic techniques. These holes are concentric with but of smaller diameter than the electrodes. After a proper lithographic mask is applied, lead lines (such as 11 in FIG. 1) are deposited, with portions extending through the membrane and making contact with respective electrodes. Finally, a high-dielectric constant layer (such as 13 in FIG. 1) is applied over the electrodes by the usual lithographic methods.

In the FIG. 2 embodiment, it is necessary to deposit or apply a removable layer on one side of the membrane. Holes are then formed through the membrane from the side opposite the removable layer. After this opposite side is properly masked, lead lines (such as 21 in FIG. 2) are deposited, with portion (such as 21a) extending through the membrane to the removable layer. This removable layer is then removed and a high-dielectric constant layer is applied to the newly exposed portions of the lead lines (such as 22 in FIG. 2). An example of a material for the removable layer is sodium silicate, which is differentially soluble. Alternatively, a high dielectric constant material may be used to initially form the pads 22 on the membrane, after which holes are formed in the membrane and leads deposited.

The FIG. 3 embodiment is the simplest to make. Depressions are formed into the frame-mounted membrane by laser ablation or some lithographic technique and lead lines are deposited with portion extending into the depression by some lithographic technique.

Although the various methods have been described as using lithographic techniques, it would obviously be possible to employ reusable masks held against the membrane. Moreover, ion milling and other techniques might be used for forming holes through or perforations into the membrane. Even though the invention has been directed to planar devices it would be possible to use the inventive techniques to form devices capable of testing non-planar circuits. In this case, a precurved frame might be employed, or the frame might be formed into its final shape after the membrane is applied, etc. Also, a flexible frame may be used. Even with a planar frame, the very nature of the thin membrane with differential air pressure will permit contacting non planar test points.

A tester made in accordance with the teachings herein has several advantages over the prior testers for integrated circuits. For example, since no sharp probes are used, the chance of damage to a circuit is minimal. Moreover, since no ohmic contact is required, variations in test readings which might result from improper contact are eliminated. Further, variations in topography of a circuit under test are automatically compensated for by the flexibility of the membrane.

We claim:

1. A method of making a flexible membrane tester for a planar electrical circuit including the steps of:

preparing a frame to hold said membrane;

affixing a relatively thin flexible membrane to said frame;

depositing a removable layer on one side of said membrane;

forming a plurality of perforations through said membrane extending to said removable layer;

depositing a plurality of combination electrode and lead lines on the side of the membrane opposite to said removable layer such that each combination includes an electrode portion at the bottom of each perforation and in planar contact with said removable layer and a lead line portion extending through said membrane and in contact with said electrode and further extending to another region on said membrane;

removing said removable layer;

and forming a high-dielectric layer on the side of each electrode that was previously in contact with the removable layer.

* * * * *